United States Patent
Tseng

(10) Patent No.: US 11,776,618 B2
(45) Date of Patent: Oct. 3, 2023

(54) MEMORY DEVICE WITH IN-MEMORY SEARCHING ARRAY AND OPERATION METHOD THEREOF FOR IMPLEMENTING FINITE STATE MACHINE

(71) Applicant: MACRONIX INTERNATIONAL CO., LTD., Hsinchu (TW)

(72) Inventor: Po-Hao Tseng, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 80 days.

(21) Appl. No.: 17/520,749

(22) Filed: Nov. 8, 2021

(65) Prior Publication Data

US 2023/0145303 A1 May 11, 2023

(51) Int. Cl.
| | |
|---|---|
| G11C 15/00 | (2006.01) |
| G11C 11/4093 | (2006.01) |
| G11C 11/4096 | (2006.01) |
| G11C 11/4072 | (2006.01) |
| G11C 11/4074 | (2006.01) |
| G11C 11/408 | (2006.01) |
| G11C 16/00 | (2006.01) |
| G11C 15/04 | (2006.01) |

(52) U.S. Cl.
CPC ...... *G11C 11/4093* (2013.01); *G11C 11/4072* (2013.01); *G11C 11/4074* (2013.01); *G11C 11/4085* (2013.01); *G11C 11/4096* (2013.01); *G11C 15/046* (2013.01); *G11C 16/00* (2013.01); *G11C 15/00* (2013.01)

(58) Field of Classification Search
CPC ............ G11C 11/4093; G11C 11/4072; G11C 11/4074; G11C 11/4085; G11C 11/4096; G11C 15/06; G11C 15/00; G11C 16/00
See application file for complete search history.

(56) References Cited

U.S. PATENT DOCUMENTS

| | | | |
|---|---|---|---|
| 6,317,349 B1 * | 11/2001 | Wong .................. | G11C 15/046 365/49.17 |
| 7,382,637 B1 * | 6/2008 | Rathnavelu ........... | G11C 15/00 365/49.17 |
| 7,801,131 B2 | 9/2010 | Horst et al. | |
| 10,620,605 B2 | 4/2020 | Buchanan et al. | |
| 10,741,244 B1 * | 8/2020 | Lee ......... | G11C 15/00 |
| 2017/0345500 A1 * | 11/2017 | Tong ....... | G11C 15/04 |
| 2022/0366988 A1 * | 11/2022 | Tseng ...... | G11C 16/26 |
| 2023/0036141 A1 * | 2/2023 | Tseng ...... | G11C 11/5642 |

* cited by examiner

*Primary Examiner* — Mushfique Siddique
(74) *Attorney, Agent, or Firm* — McClure, Qualey & Rodack, LLP

(57) ABSTRACT

The present invention discloses a memory device and operation method thereof. The operation method comprises: programming a plurality of first strings of a plurality of string pairs representing a finite state machine (FSM) to an in-memory-searching (IMS) array of a memory device; programming a plurality of second strings of the string pairs to a working memory of the memory device; and programming a string representing a starting state of the FSM to a buffer of the memory device.

8 Claims, 7 Drawing Sheets

MEMORY DEVICE WITH IN-MEMORY SEARCHING ARRAY AND OPERATION METHOD THEREOF FOR IMPLEMENTING FINITE STATE MACHINE

BACKGROUND OF THE INVENTION

Field of the Invention

The invention relates to a memory device and an operation method thereof.

Description of the Related Art

Finite state machine (FSM) is a calculation model that could be used to simulate sequential logic circuit and computer program. FSM could be implemented by software or hardware.

FSM could generate regular language. Regular expression matching is generally implemented with FSM, and could be applied to establish model in the fields such as mathematics, artificial intelligence, games, and linguistics.

When implementing regular expression matching and FSM with hardware, not only computing efficiency must be considered, but also space efficiency must be considered. In view of this, a hardware implementation with both computational efficiency and space efficiency is an important research topic.

SUMMARY OF THE INVENTION

An embodiment of the present invention discloses a memory device, comprising a first driver circuit, a second driver circuit, an in-memory-searching (IMS) array, a sensing circuitry, a working memory and a buffer. The IMS array comprises a plurality of memory cells. The memory cells are coupled to the first driver circuit via a plurality of first signal lines, and coupled to the second driver circuit via a plurality of third signal lines. The memory cells are configured to store a plurality of first strings of a plurality of string pairs generated according to a finite state machine (FSM). The sensing circuitry is coupled to the IMS array. The sensing circuitry comprises a plurality of sensing units coupled to the memory cells via a plurality of second signal lines. The working memory is coupled to the sensing circuitry. The working memory having a plurality of memory addresses one-to-one corresponding to the sensing units, and configured to store a plurality of second strings of the string pairs. The buffer is coupled to the working memory and the first driver circuit. The buffer configured to store a string representing a starting state of the FSM while the FSM is initialized.

Another embodiment of the present invention discloses an operation method of memory device, comprising: programming a plurality of first strings of a plurality of string pairs representing a finite state machine (FSM) to an in-memory-searching (IMS) array of a memory device; programming a plurality of second strings of the string pairs to a working memory of the memory device; and programming a string representing a starting state of the FSM to a buffer of the memory device.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
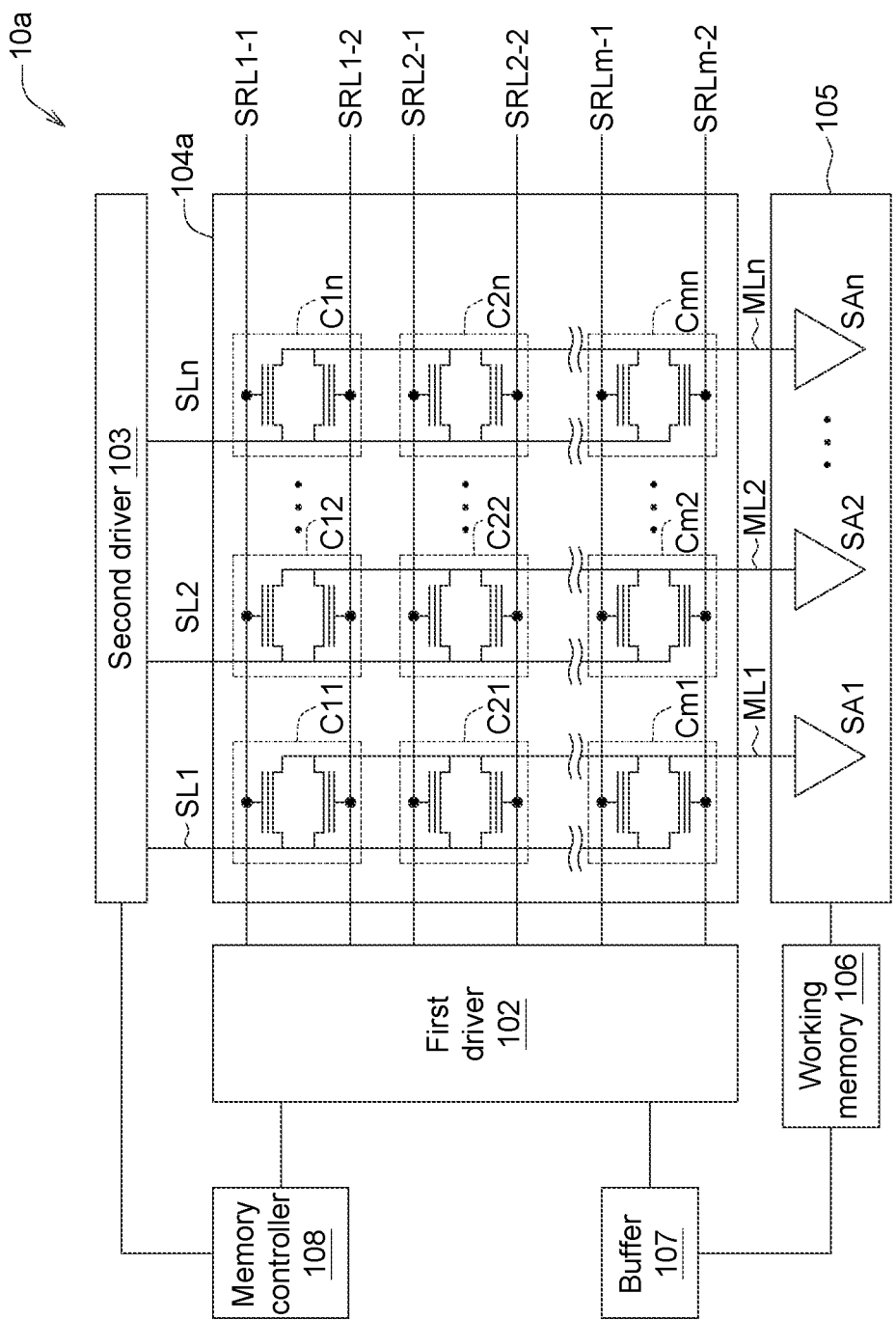
FIG. 1A shows a block diagram of a memory device according to an embodiment of the present invention.

Referring to FIG. 1A, FIG. 1A shows a block diagram of a memory device according to an embodiment of the present invention. A memory device $10a$ includes a first driver circuit 102, a second driver circuit 103, an in-memory-searching (IMS) array $104a$, a sensing circuitry 105, a working memory 106, a buffer 107 and a memory controller 108.

The IMS array $104a$ includes a number of memory cells C11~Cmn, a number sets of first signal lines SRL1-1, SRL1-2~SRLm-1, SRLm-2, a number of second signal lines ML1~MLn and a number of third signal lines SL1~SLn. Each of the memory cells Cij is coupled to the first driver circuit 102 via a corresponding first signal line set SRLi-1, SRLi-2. and a corresponding bit line BLj, wherein i is an integer not smaller than 1 and not greater than m. A number of memory cells C1j~Cmj form a memory cell string. Each of the memory cell strings is coupled to the sensing circuit 105 via a corresponding second signal line MLj, and coupled to the second driver circuit 103 via a corresponding third signal line SLj, wherein j is an integer not smaller than 1 and not greater than n. in this embodiment, the IMS array $104a$ is a NOR type non-volatile memory. Each memory cell Cij could include two transistors, where the gates of the two transistors are respectively coupled to the first signal lines SRLi-1, SRLi-2. The transistors could be MOSFET, FeFET, or any type that is practicable. This architecture is called ternary content addressable memory (TCAM). By programming the combination of threshold voltages of the two transistors of the memory cell, the memory cells C11~Cmn could be programed to store 0 and 1, or further to store 0, 1 and don't care, wherein don't care would be matched whether 0 or 1 is searched. For brevity, "programming the memory cells on a specific second/third signal line" would be simplified to "programming a specific second/third signal line", and "a data string stored in the memory cells on a specific second/third signal line" would be simplified to "a data string of a specific second/third signal line".

The sensing circuitry 105 is coupled to the IMS array $104a$. The sensing circuitry 105 includes a number of sensing units SA1~SAn. In this embodiment, the sensing units SA1~SAn are one-to-one coupled to the second signal lines ML1~MLn. The sensing unit is configured to output a signal according to the magnitude of a current sensed from the coupled second signal line, wherein the signal output by the sensing unit represents whether the data string of the second signal line coupled to the sensing unit is matched with the data string to be searched. in an embodiment, when the current sensed from the second signal line coupled to the sensing unit is greater than the predetermined threshold, it could be determined that the data string of the second signal line coupled to the sensing unit is matched with the data string to be searched.

The working memory 106 is coupled to the sensing circuitry 105. The working memory 106 could be volatile memory or non-volatile memory. The working memory 106 includes a number of memory addresses. In an embodiment, the memory addresses could one-to-one correspond to the sensing units of the sensing circuitry. The buffer 107 is coupled to the working memory 106 and the first driver circuit 102.

The memory controller 108 could be coupled to the first driver circuit 102, the second driver circuit 103, the sensing circuitry 105, the working memory 106 and the buffer 107, and configured to control the first driver circuit 102, the second driver circuit 103, the sensing circuitry 105, the working memory 106 and the buffer 107 by signals.

Figure 1B:
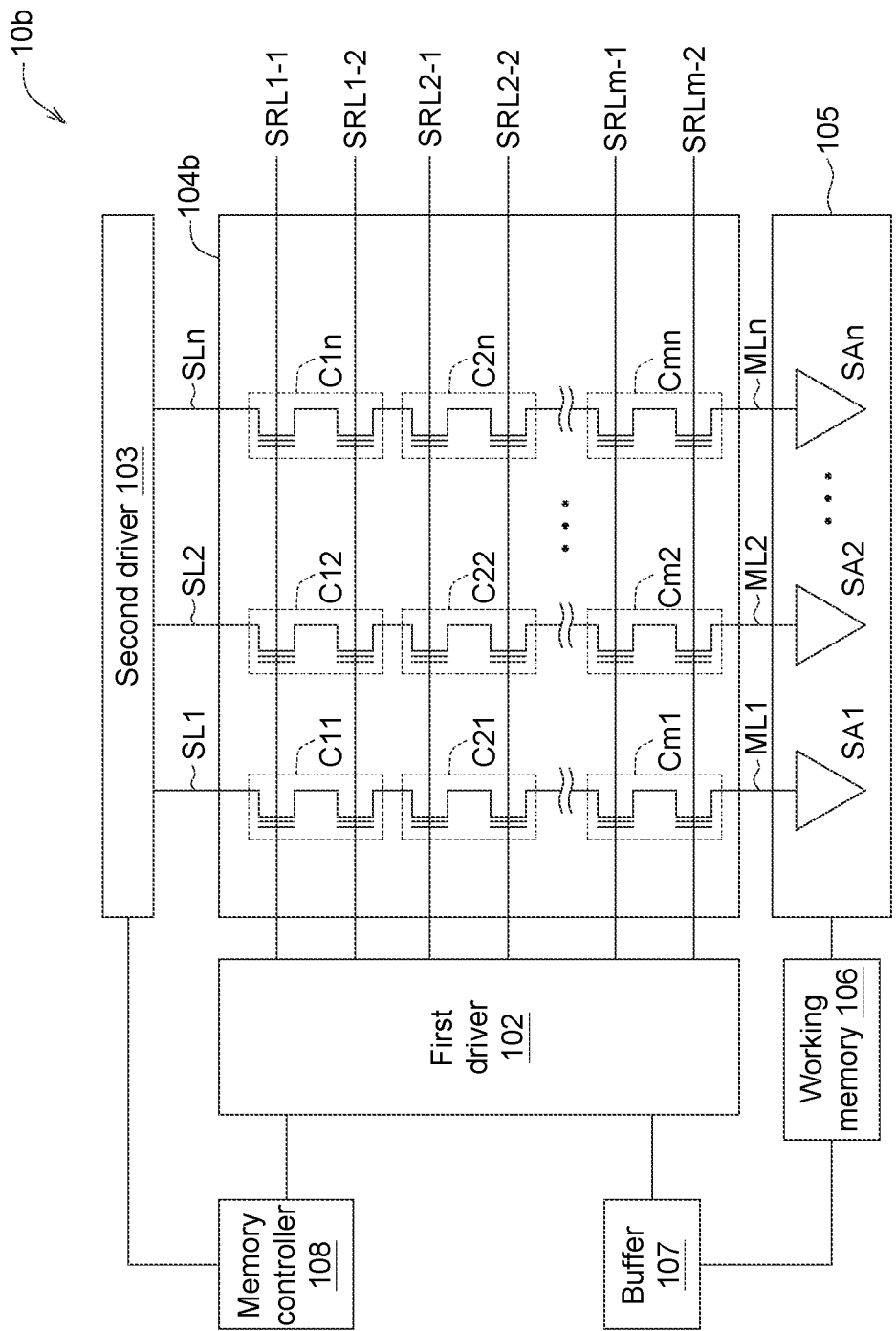
FIG. 1B shows a block diagram of a memory device according to another embodiment of the present invention.

Referring to FIG. 1B, FIG. 1B shows a memory device according to another embodiment of the present invention. The memory device 10b is similar to the memory device 10a in architecture. The difference is the IMS array 104b is different from the IMS array 104a. In this embodiment, the IMS array 104b is a NAND-type non-volatile memory. Each of the memory cells includes two transistors serial connected. A number of the memory cells are serial connected between a second signal line and a third signal line to form a memory cell string for storing a data string.

In order to illustrate how the memory device 10a and 10b could implement a finite state machine (FSM), an exemplary FSM would be taken for illustration.

Figure 2:
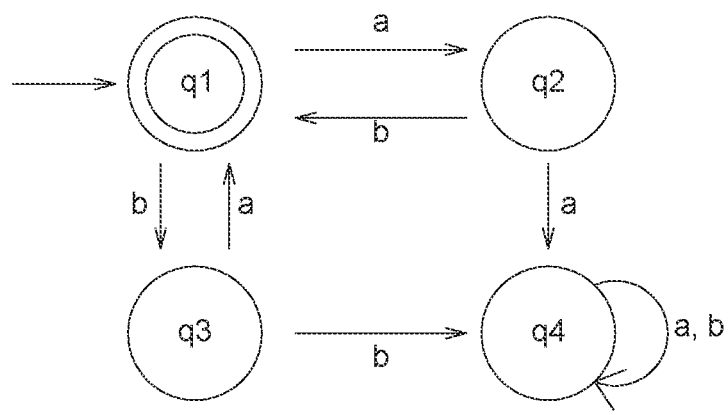
FIG. 2 shows a finite state machine.

Referring to FIG. 2, FIG. 2 shows a block diagram of a FSM. The FSM 2 includes four states q1~q4, wherein q1 is the starting state, and q1 is also the accepting state, a, b are inputs. According to the regular expression of the FSM 2, a number of state transition cases of the FSM 2 are shown in Table 1. Table 1 shows eight state transition cases of the FSM 2, including: for the current state is q1, if the input is a, the next state is q2, and if the current input is b the next state is q3; for the current state is q2, if the current input is a, the next state is q4, and if the current input is b the next state is q1; for the current state is q3, if the current input is a, the next state is q1, and if the current input is b, the next state is q4; for the current state is q4, if the current input is a, the next state is q4, and if the current input is b, the next state is q4. Noted that since transferring the FSM to regular expression is well known by a person having ordinary skill in the art, it would not be described herein.

TABLE 1

| current state | current input | next state |
| --- | --- | --- |
| q1 | a | q2 |
| q1 | b | q3 |
| q2 | a | q4 |
| q2 | b | q1 |
| q3 | a | q1 |
| q3 | b | q4 |
| q4 | a | q4 |
| q4 | b | q4 |

Next, the states q1~q4 and the allowable input a, b of the FSM 2 would be encoded. In an embodiment, q1 is encoded as 00, q2 is encoded as 01, q3 is encoded as 10, q4 is encoded as 11, a is encoded as 0001, and b is encoded as 0010. After encoding, Table 1 could be transferred to FIG. 2.

TABLE 2

| current state | current input | next state |
| --- | --- | --- |
| 00 | 0001 | 01 |
| 00 | 0010 | 10 |
| 01 | 0001 | 11 |
| 01 | 0010 | 00 |
| 10 | 0001 | 00 |
| 10 | 0010 | 11 |
| 11 | 0001 | 11 |
| 11 | 0010 | 11 |

According to the encoded states, the encoded allowable inputs, and the state transition cases, a number of string pairs would be generated, wherein the string pairs one-to-one correspond to the state transition cases, and each of the string pairs includes a first string and a second string. The first string includes the encoded current state and the encoded current input. The second string includes the encoded next state. For example, the state transition case "if the current state is q1 (00) and the current input is a (0001), the next state is q2 (01)" corresponds to a string pair [000001,01], the state transition case "if the current state is q1 (00) and the current input is b (0010), the next state is q3 (10)" corresponds to a string pair [000010,10], and so on. That is, for each of the string pairs, in the first string, a first portion codewords represents the current state, and a second portion codewords represents the current input, and the second string represents the next state corresponding to the current state and the current input. Table 3 shows an example of the string pairs of the FSM 2.

TABLE 3

| first string | second string |
| --- | --- |
| 000001 | 01 |
| 000010 | 10 |
| 010010 | 00 |
| 100001 | 00 |
| 100010 | 11 |
| 110001 | 11 |
| X10010 | 11 |

Figure 3:
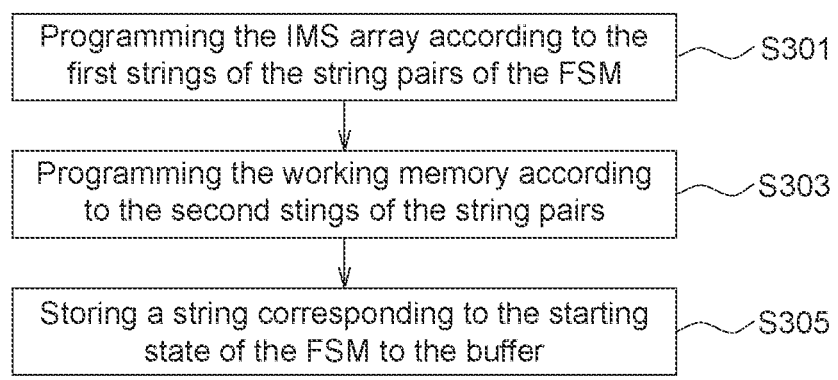
FIG. 3 shows a flowchart of an operation method of memory device according to an embodiment of the present invention.

Referring to FIG. 3, FIG. 3 shows a flowchart of an operation method of memory device according to an embodiment of the present invention. After the encoding and obtaining of the string pairs, FSM could be establish on the memory device 10a (or 10b) by using the operation method shown in FIG. 3.

At S301, the IMS array 104a/104b would be programmed according to the first strings of the string pairs. The architecture of the memory device 10a is taken as the example. It is assumed that m is 6, and n is 8. The memory controller 108 commands the first driver circuit 102 and the second driver circuit 103 to apply suitable programming voltages (depends on the actual hardware specification) to one-to-one program the first strings to different third signal lines. For example, the first string 000001 of the string pair corresponding to "if the current state is q1 and the current input is a, the next state is q2" could be programmed to the memory cells C11~C61 on the third signal line SL1, the first string 000010 of the string pair corresponding to "if the current state is q1 and the current input is b, the next state is q3" could be programmed to the memory cells C12~C62 on the third signal line SL2, and so on.

At S303, the working memory 106 would be programmed according to the second strings of the string pairs. Taking the memory device 10a as the example, the second string 01 of the string pair corresponding to "if the current state is q1 and the current input is a, the next state is q2" could be programmed to a memory address corresponding to the third signal line ML1 (the sensing unit SA1), the second string 10 of the string pair corresponding to "if the current state is q1 and the current input is b, the next state is q3" could be programmed to a memory address corresponding to the third signal line ML2 (the sensing unit SA2), and so on.

At S305, a string corresponding to the starting state of the FSM would be stored to the buffer. Step S305 is performed for initialize the FSM established by steps S301 and S305.

Figure 4:
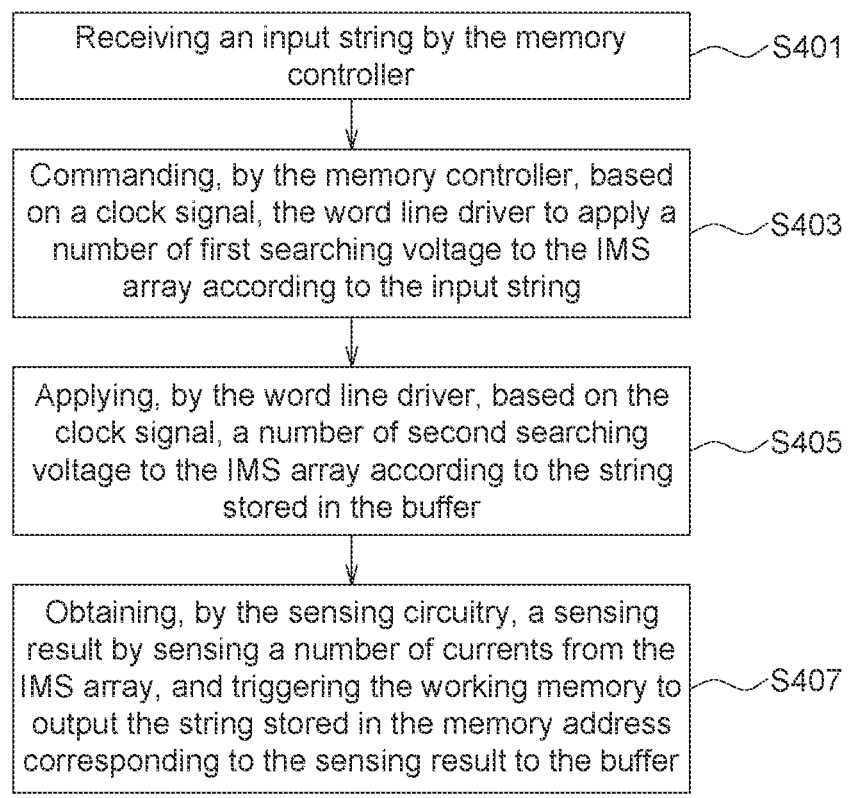
FIG. 4 shows a flowchart of an operation method of memory device according to another embodiment of the present invention.

Referring to FIG. 4, FIG. 4 shows a flowchart of an operation method of memory device according to another embodiment of the present invention. The process in FIG. 4 could be continued after the process in FIG. 3. With the process in FIG. 4, the operation of the FSM could be realized.

At S401, the memory controller receives an input string. The input string is obtained by encoding an input to be input to the FSM. As in the previous example, when the input is a, the input string is 0001, and when the input is b, the input string is 0010.

At S403, the memory controller, based on a clock signal, commands the first driver circuit 102 to apply a number of first searching voltage to the IMS array 104a/104b according to the input string. For example, it is assumed that the input is a. During a first clock cycle of the clock signal, the memory controller 108 commands, according to the input string 0001 which represents a, the first driver circuit 102 to apply the first searching voltage corresponding to 0 to the first signal line set SRL3-1, SRL3-2, apply the first searching voltage corresponding to 0 to the first signal line set SRL4-1, SRL4-2, apply the first searching voltage corresponding to 0 to the first signal line set SRL5-1, SRL5-2, and apply the first searching voltage corresponding to 1 to the first signal line set SRL6-1, SRL6-2.

At S405, the first driver circuit 102, based on the clock signal, applies a number of second searching voltage to the IMS array 104a/104b according to the string stored in the buffer 107. Continuing the previous example, during the first clock cycle, the string 00 representing the starting state q1 is stored in the buffer 107. Therefore, the word line driver 102 applies the second searching voltage corresponding to 0 to the first signal line set SRL1-1, SRL1-2, and applies the second searching voltage corresponding to 0 to the first signal line set SRL2-1, SRL2-2.

At S407, the sensing circuitry 105 obtains a sensing result by sensing a number of currents from the IMS array 104a/104b, and triggers the working memory 106 to output the second string stored in a memory address corresponding to the sensing result to the buffer 107. In an embodiment, the sensing result indicates which of the sensing units in the sensing circuitry 105 has detected a current greater than the predetermined threshold. Based on the sensing result, it could be determined that which of data string on the third signal lines is matched. Continuing the previous example, the searching voltages applied to the first signal line SRL1~SRL6 representing the data string to be searched is 000001. The data string of the third signal line SL1 matches 000001. Therefore, a current greater than the predetermined threshold could pass through the memory cells C11~C16, and sensed by the sensing unit SA1. The data strings of the third signal lines SL2~SL8 do not match 000001. Therefore, no current greater than the predetermined threshold could be sensed by the sensing units SA2~SA8. Based on the sensing result, the sensing circuitry 105 would output a signal to cause the working memory 106 to output the second string 01 stored in the memory address corresponding to the sensing unit SA1 to buffer 107. The original string 00 stored in the buffer would be overwritten by the string 01 which is output by the working memory 106. This step is equivalent to transfer the current state from q1 to q2.

Figure 5A:
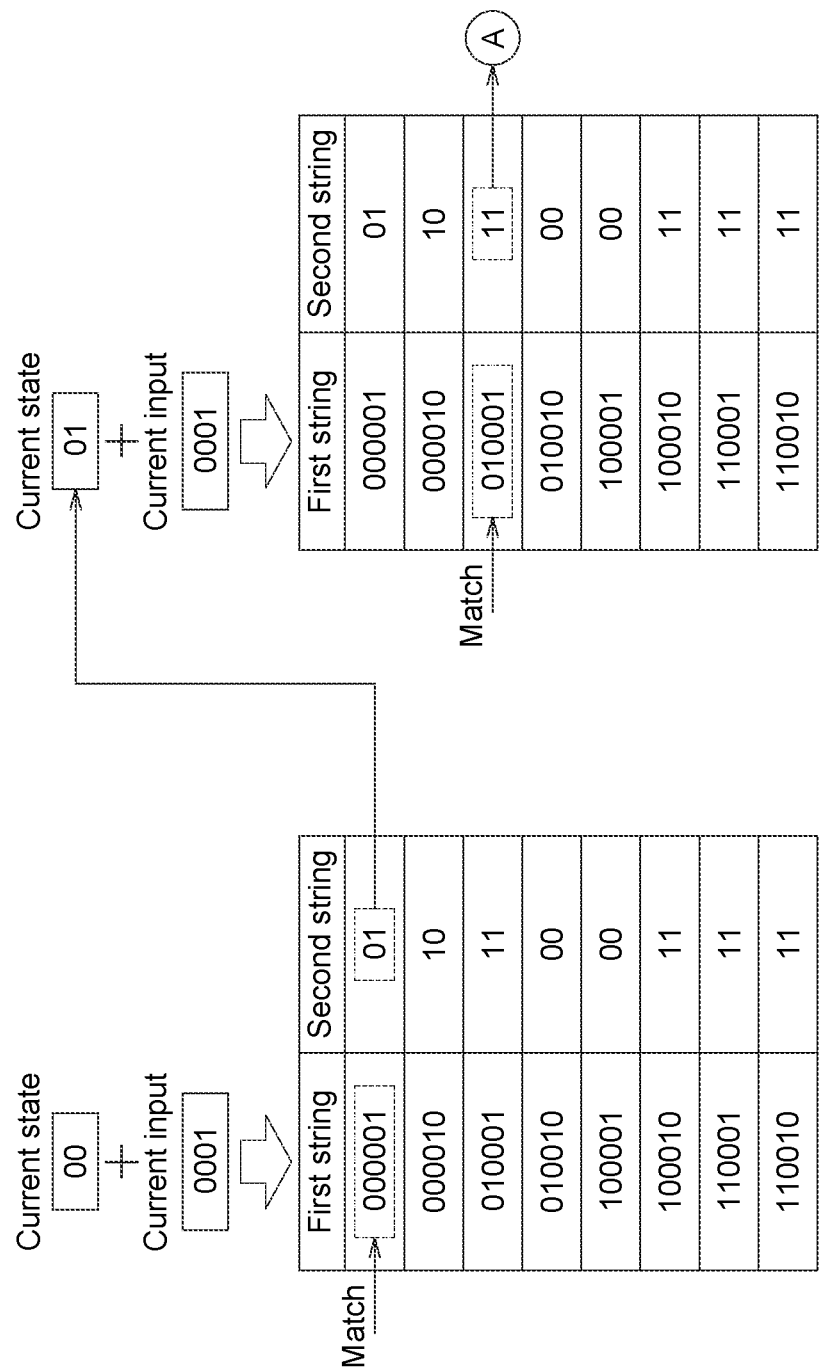
FIGS. 5A-5C show schematic diagrams of operation of memory-based FSM according to an embodiment of the present invention.
Figure 5B:
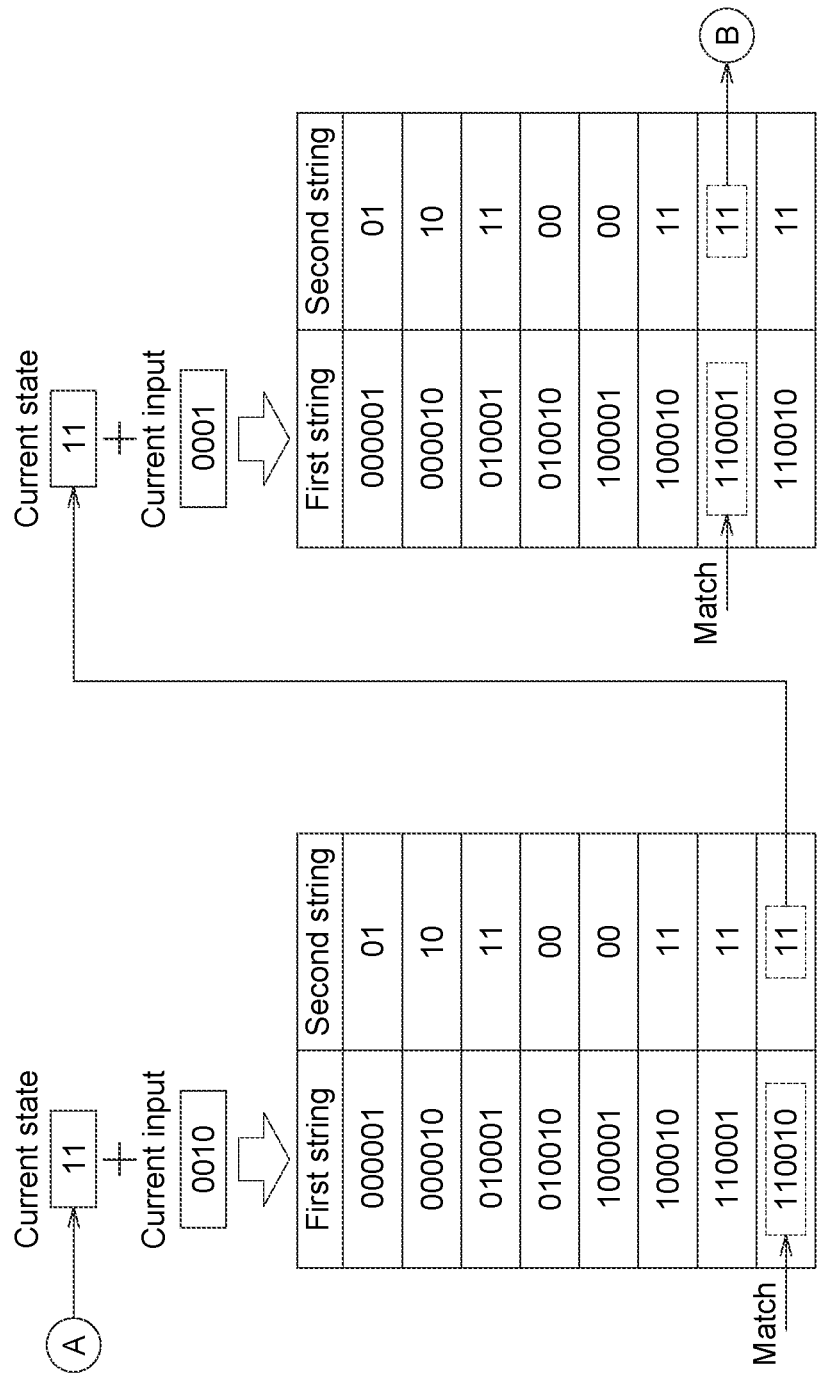
Figure 5C:
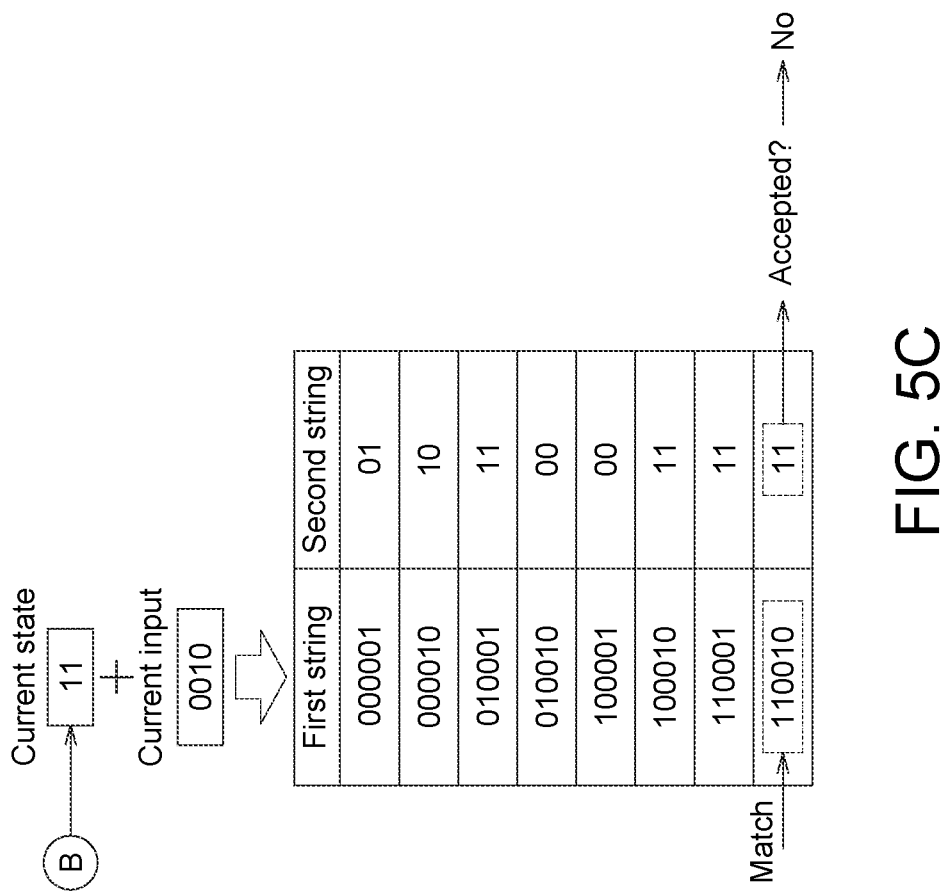

In practical applications, the input to FSM may be a sequence of inputs. That is, a number of inputs with a specific order would be input to FSM. For such an input sequence, steps S401~S407 would be performed repeatedly. I it would be illustrated with an example and FIGS. 5A~5C hereafter. In FIGS. 5A~5C, the field "first string" represents the first string stored on multiple different second signal lines (such as ML1~ML8), the field "second string" represents the second strings stored in the memory addresses of the working memory 106 corresponding to the multiple second signal lines, the current state represents the data string currently stored in the buffer 107, and the current input represents the input of the current input sequence to be currently executed. It is assuming that an input sequence is a, a, b, a, b. The corresponding input string sequence would be 0001, 0001, 0010, 0001, 0010. Referring to the left part of FIG. 5A, during a first clock cycle of the clock signal, the buffer 107 stores the starting state 00 (q1), the first driver circuit 102 applies the searching voltages corresponding to 000001 (the combination of 00 representing the current state and 0001 representing the current input, the following could be deduced by analogy) to the first signal line sets SRL1-1, SRL1-2~SRL6-1, SRL6-2, the sensing circuitry 105 detects the current greater that the predetermined threshold from the second signal line ML1 (000001 matched) and cause the working memory 106 to output the second string 01 (q2) stored in the memory address corresponding to the third signal line SL1 to the buffer 107 for overwriting 00 (q1). Referring to the right part of FIG. 5A, during a second clock cycle of the clock signal, the buffer 107 stores the current state 01 (q2), the first driver circuit 102 applies the searching voltages corresponding to 010001 (the combination of 01 and 0001) to the first signal line sets SRL1-1, SRL1-2~SRL6-1, SRL6-2, the sensing circuitry 105 detects the current greater that the predetermined threshold from the second signal line ML3 (010001 matched) and cause the working memory 106 to output the second string 11 (q4) stored in the memory address corresponding to the third signal line SL3 to the buffer 107 for overwriting 01 (q2). Referring to the left part of FIG. 5B, during a third clock cycle of the clock signal, the buffer 107 stores the current state 11 (q4), the first driver circuit 102 applies the searching voltages corresponding to 110010 (the combination of 11 and 0010) to the first signal line sets SRL1-1, SRL1-2~SRL6-1, SRL6-2, the sensing circuitry 105 detects the current greater that the predetermined threshold from the second signal line ML8 (110010 matched) and cause the working memory 106 to output the second string 11 (q4) stored in the memory address corresponding to the third signal line SL8 to the buffer 107 for overwriting 11 (q4). Referring to the right part of FIG. 5B, during a fourth clock cycle of the clock signal, the buffer 107 stores the current state 11 (q4), the first driver circuit 102 applies the searching voltages corresponding to 110001 (the combination of 11 and 0001) to the first signal line sets SRL1-1, SRL1-2~SRL6-1, SRL6-2, the sensing circuitry 105 detects the current greater that the predetermined threshold from the second signal line ML7 (110001 matched) and cause the working memory 106 to output the second string 11 (q4) stored in the memory address corresponding to the third signal line SL7 to the buffer 107 for overwriting 11 (q4). Referring to FIG. 5C, during a fifth clock cycle of the clock signal, the buffer 107 stores the current state 11 (q4), the first driver circuit 102 applies the searching voltages corresponding to 110010 (the combination of 11 and 0010) to the first signal line sets SRL1-1, SRL1-2~SRL6-1, SRL6-2, the sensing circuitry 105 detects the current greater that the predetermined threshold from the second signal line ML8 (110010 matched) and cause the working memory 106 to output the second string 11 (q4) stored in the memory address corresponding to the third signal line SL8 to the buffer 107 for overwriting 11 (q4).

After performing steps S401~S407 for each input of the input sequence, it could be determined that whether the input sequence is accepted by the FSM according to the string stored in the buffer 107. While the state represented by the string finally stored in the buffer 107 is same as the accepting state, it could be determined that the input sequence is accepted by the FSM. For example, the string finally stored in the buffer 107 is not 00 which represents the accepting state q1, but 11 which represents q4. Therefore, it could be determined that the input sequence a, a, b, a, b would not be accepted by the FSM 2, as shown in the lower right corner of FIG. 5C. The determination could be made by the memory controller 108, or a specific purpose circuitry (not shown).

Noted that in the processes described above, the second driver circuit 103 would be controlled by the memory controller 108 to apply suitable bias voltage at correct timing to allow the operation of in-memory-searching to be performed. "Correct timing" and "suitable bias voltage" depend on the actual specification of the memory device.

In order to improve the space efficiency of the IMS array, the string pairs could be integrated. When integrating, the different bit(s) of the first string of at least two of string pairs with the same second string would be replaced by don't care. For example, Table 4 could be generated after integration is performed for Table 3.

TABLE 4

| first string | second string |
|---|---|
| 000001 | 01 |
| 000010 | 10 |
| 010001 | 11 |
| 010010 | 00 |
| 100001 | 00 |
| 1X0010 | 11 |
| 110001 | 11 |

In Table 4, X represents don't care. In order to program the first strings of the string pairs in Table 4, the IMS array is required to have the memory cells that support the programming of don't care.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a first driver circuit;
a second driver circuit;
an in-memory-searching (IMS) array, comprising a plurality of memory cells, the memory cells coupled to the first driver circuit via a plurality of word lines, and coupled to the second driver circuit via a plurality of third signal lines, the memory cells configured to store a plurality of first strings of a plurality of string pairs generated according to a finite state machine (FSM);
a sensing circuitry, the sensing circuitry comprising a plurality of sensing units coupled to the memory cells via a plurality of second signal lines;
a working memory, coupled to the sensing circuitry, the working memory having a plurality of memory addresses one-to-one corresponding to the sensing units, and configured to store a plurality of second strings of the string pairs; and
a buffer, coupled to the working memory and the first driver circuit, the buffer configured to store a string representing a starting state of the FSM while the FSM is initialized,
each of the first strings comprises a first portion codewords and a second portion codewords, the first portion codewords represents a current state, and the second portion codewords represents a current input.

2. The memory device according to claim 1, wherein each of the second strings represents a next state.

3. The memory device according to claim 1, wherein the sensing circuitry is configured to cause the working memory to output the second string stored in the memory addresses corresponding to the sensing unit which has sensed a current greater than a predetermined threshold to the buffer according to a sensing result obtained by the sensing units.

4. The memory device according to claim 1, wherein the word line driver, based on a clock signal, is configured to apply a plurality of first searching voltage representing an input of the FSM, and apply a plurality of second searching voltages according to the string stored in the buffer to the first signal lines.

5. An operation method of memory device, comprising:
programming a plurality of first strings of a plurality of string pairs representing a finite state machine (FSM) to an in-memory-searching (IMS) array of a memory device;
programming a plurality of second strings of the string pairs to a working memory of the memory device; and
programming a string representing a starting state of the FSM to a buffer of the memory device,
wherein each of the first strings comprises a first portion codewords and a second portion codewords, the first portion codewords represents a current state, and the second portion codewords represents a current input.

6. The operation method according to claim 5, wherein each of the second strings represents a next state.

7. The operation method according to claim 5, further comprising:
applying, by a first driver circuit of the memory device, based on a clock signal, a plurality of first searching voltage representing an input of the FSM, and a plurality of second searching voltages according to the string stored in the buffer to a plurality of first signal lines of the memory device.

8. The operation method according to claim 5, further comprising:
causing, by a sensing circuitry of the memory device, a working memory of the memory device to output the second string stored in the memory addresses corresponding to a sensing unit of the sensing circuitry which has sensed a current greater than a predetermined threshold to the buffer according to a sensing result obtained by a plurality of sensing units of the sensing circuitry.

* * * * *